US009382084B2

(12) United States Patent
Iesaki

(10) Patent No.: US 9,382,084 B2
(45) Date of Patent: *Jul. 5, 2016

(54) TRANSPORTING SYSTEM, IMAGE FORMING SYSTEM, AND CONTROLLER

(71) Applicant: Brother Kogyo Kabushiki Kaisha, Nagoya-shi, Aichi-ken (JP)

(72) Inventor: Kenichi Iesaki, Ichinomiya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 107 days.

This patent is subject to a terminal disclaimer.

(21) Appl. No.: 14/069,683

(22) Filed: Nov. 1, 2013

(65) Prior Publication Data

US 2014/0291926 A1 Oct. 2, 2014

(30) Foreign Application Priority Data

Mar. 29, 2013 (JP) ................................. 2013-072750

(51) Int. Cl.
*B65H 7/02* (2006.01)
*B65H 7/06* (2006.01)
(Continued)

(52) U.S. Cl.
CPC ...... *B65H 7/06* (2013.01); *B32B 27/08* (2013.01); *B32B 27/322* (2013.01); *B32B 27/34* (2013.01); *B41J 13/0027* (2013.01); *B65H 5/06* (2013.01); *B65H 5/062* (2013.01); *B65H 7/20* (2013.01); *H05K 1/036* (2013.01);
(Continued)

(58) Field of Classification Search
CPC .. B65H 23/192; B65H 23/18; B65H 23/1888; B65H 7/20; B65H 2513/104; B65H 2513/106; B65H 2553/51; B65H 2557/20

USPC ................................ 271/270, 258.01, 265.01
See application file for complete search history.

(56) References Cited

U.S. PATENT DOCUMENTS 5,742,318 A * 4/1998 Miyauchi et al. ............. 347/134
5,794,927 A 8/1998 Uchida
(Continued)

FOREIGN PATENT DOCUMENTS

JP 2000-310928 A 11/2000
JP 2006-008322 A 1/2006
(Continued)

OTHER PUBLICATIONS

Notice of Allowance issued in corresponding U.S. Appl. No. 14/069,420 mailed Jul. 9, 2014.
(Continued)

*Primary Examiner* — Thomas Morrison
(74) *Attorney, Agent, or Firm* — Banner & Witcoff, Ltd.

(57) ABSTRACT

There is provided a transporting system including two rollers to transport a sheet, two driving devices to drive the rollers, two measuring devices to measure state quantities Z1 and Z2 concerning the rollers, and a controller to control the transport. The controller includes first and second estimating units to estimate values R1 and R2 related to reaction forces act on the rollers, a first calculating unit to calculate control input U1 in accordance with a deviation between a target state quantity and (Z1+Z2)/2, a second calculating unit to calculate control input U2 in accordance with a deviation between a target value and (R1−R2)/2, a first drive controller to input a control signal in accordance with (U1+U2) to the first driving device, and a second drive controller to input a control signal in accordance with (U1−U2) to the second driving device.

11 Claims, 9 Drawing Sheets

(51) Int. Cl.
  *B41J 13/00* (2006.01)
  *B65H 7/20* (2006.01)
  *B65H 5/06* (2006.01)
  *B32B 27/08* (2006.01)
  *B32B 27/32* (2006.01)
  *B32B 27/34* (2006.01)
  *H05K 1/03* (2006.01)

(52) U.S. Cl.
  CPC .... *B32B 2457/08* (2013.01); *B65H 2301/4474* (2013.01); *B65H 2404/143* (2013.01); *B65H 2515/31* (2013.01); *B65H 2515/32* (2013.01); *B65H 2553/51* (2013.01); *Y10T 428/3154* (2015.04); *Y10T 428/31544* (2015.04)

(56) References Cited

U.S. PATENT DOCUMENTS

| | | | |
|---|---|---|---|
| 7,971,878 B2 * | 7/2011 | Hashimoto et al. | 271/274 |
| 8,465,013 B2 * | 6/2013 | Ashikawa | 271/3.18 |
| 8,616,671 B2 | 12/2013 | Lawther et al. | |
| 8,876,241 B2 * | 11/2014 | Iesaki | 347/16 |
| 2011/0056796 A1 | 3/2011 | Takeda et al. | |
| 2015/0061207 A1 * | 3/2015 | Iesaki | 271/3.2 |

FOREIGN PATENT DOCUMENTS

| | | |
|---|---|---|
| JP | 2013-072749 A | 4/2013 |
| JP | 2013-072750 A | 4/2013 |
| JP | 2014-196184 | 10/2014 |
| JP | 2014-197319 | 10/2014 |

OTHER PUBLICATIONS

Jul. 30, 2014—(EP) Extended EP Search Report App—13191289.1.
Jul. 31, 2014—(EP) Extended EP Search Report—App 14172442.7.
Nov. 1, 2013—(US) Co-pending U.S. Appl. No. 14/069,420.
Jun. 19, 2014—(US) Co-pending U.S. Appl. No. 14/308,947.
Mar. 29, 2013—(JP) Pending Application 2013-072749.
Mar. 29, 2013—(JP) Pending Application 2013-072750.
Jan. 30, 2015—(US) Notice of Allowance—U.S. Appl. No. 14/308,947.

* cited by examiner

Fig. 8

| SHEET TYPE | TARGET TENSION Rs<br>HIGH ←→ LOW | ZERO TENSION SECTION<br>LONG ←→ SHORT |
|---|---|---|
| **** | **** | **** |
| **** | **** | **** |
| **** | **** | **** |
| **** | **** | **** |
| **** | **** | **** |

TRANSPORTING SYSTEM, IMAGE
FORMING SYSTEM, AND CONTROLLER

CROSS REFERENCE TO RELATED
APPLICATION

The present application claims priority from Japanese Patent Application No. 2013-072750, filed on Mar. 29, 2013, the disclosure of which is incorporated herein by reference in its entirety.

BACKGROUND OF THE INVENTION

1. Field of the Invention

The present invention relates to transporting systems for transporting sheets, image forming systems, and controllers.

2. Description of the Related Art

Conventionally, as transporting systems for transporting sheets, there have been known systems with a plurality of rollers provided along a sheet transporting path.

Further, also as transporting systems, there have been known systems which send out sheets, which are convolved into rolls, to the downstream side of the transporting path. For example, there is known such a system which includes a send-out roller provided to send out a sheet convolved into a roll, and a transporting roller provided on the downstream side from the send-out roller.

This transport system controls the speed of the sheet by controlling the send-out roller and the transporting roller. Further, it controls the tension of the sheet by controlling the send-out roller while carrying out a correction which takes the tension of the sheet into consideration.

SUMMARY OF THE INVENTION

However, in the conventional techniques, although the driving control for adjusting the sheet speed is carried out for a plurality of rollers, the driving control for adjusting the sheet tension is carried out only for the send-out roller among the plurality of rollers. Therefore, there is a problem that it is difficult to carry out a high-precision control of the tension.

Especially, in a system transporting a short sheet such as a paper sheet of a standard size, etc., if the sheet is subjected to an excessive load, then slippage will occur between the rollers and the sheet. Hence, it is difficult to carry out the controls properly by conventional way which controls the sheet tension with only one roller while controlling a state quantity of the sheet (position, speed, acceleration, or the like.).

The present teaching is made in view of such problems, and an object thereof is to provide a technique capable of controlling the state quantity and tension of a sheet with high precision in a system transporting the sheet with a plurality of rollers.

According to a first aspect of the present teaching, there is provided a transporting system including:

a first roller and a second roller arranged apart from each other along a transporting path of a sheet to transport the sheet;

a first driving device configured to drive the first roller to rotate;

a second driving device configured to drive the second roller to rotate;

a first measuring device configured to measure a state quantity $Z1$ concerning a rotary motion of the first roller;

a second measuring device configured to measure a state quantity $Z2$ concerning a rotary motion of the second roller; and a controller configured to control an operation of transporting the sheet with the rotations of the first roller and the second roller, by controlling the first driving device and the second driving device, the controller including:

a first estimating unit configured to estimate a value $R1$ related to a reaction force which acts on the first roller in a case that the first roller is driven to rotate by the first driving device;

a second estimating unit configured to estimate a value $R2$ related to a reaction force which acts on the second roller in a case that the second roller is driven to rotate by the second driving device;

a first calculating unit configured to calculate a control input $U1$ in accordance with a deviation between a target state quantity, and a state quantity of the sheet $(Z1+Z2)/2$ corresponding to the sum $(Z1+Z2)$ of the state quantity $Z1$ measured by the first measuring device and the state quantity $Z2$ measured by the second measuring device;

a second calculating unit configured to calculate a control input $U2$ in accordance with a deviation between a target value, and a value $(R1-R2)/2$ corresponding to the difference $(R1-R2)$ between the value $R1$ estimated by the first estimating unit and the value $R2$ estimated by the second estimating unit;

a first drive controller configured to input, to the first driving device, a control signal in accordance with the sum $(U1+U2)$ of the control input $U1$ and the control input $U2$; and a second drive controller configured to input, to the second driving device, a control signal in accordance with the difference $(U1-U2)$ between the control input $U1$ and the control input $U2$.

According to the transporting system of the present teaching, the control input $U1$ for controlling the state quantity of the sheet, and the control input $U2$ for controlling the tension of the sheet are calculated and the control inputs for the first driving device and the second driving device are set to be the sum $(U1+U2)$ of, and the difference $(U1-U2)$ between, the control inputs $U1$ and $U2$, respectively.

Supposing that the sheet is under a standstill condition, in order to generate a tension in the sheet, it is conceivable to cause some forces with the same magnitude but in mutually opposite directions to act on the sheet respectively from the first roller and the second roller. This is the reason why the component $+U2$ is included in the control input for the first driving device, and the component $-U2$ is included in the control input for the second driving device.

That is, according to the present teaching, the state quantity of the sheet is properly controlled according to the component $U1$ included in the control input $(U1+U2)$ for the first driving device, and in the control input $(U1-U2)$ for the second driving device. Further, the tension of the sheet is properly controlled according to the component $+U2$ included in the control input for the first driving device, and the component $-U2$ included in the control input for the second driving device.

According to the present teaching, by using the sum of, and the difference between, the control inputs $U1$ and $U2$, to control the first driving device and the second driving device, it is possible to control the state quantity and tension of the sheet with high precision in transport of the sheet with the two rollers. As a result, according to the present teaching, it is possible to construct the transporting system with high performance.

According to a second aspect of the present teaching, there is provided an image forming system including:

an image forming device provided above a transporting path of a sheet to form images on the sheet by jetting ink droplets;

a first roller and a second roller configured to transport the sheet and arranged in the transporting path across a section which is defined within the transporting path and above which the image forming device is provided;

a first driving device configured to drive the first roller to rotate;

a second driving device configured to drive the second roller to rotate;

a first measuring device configured to measure a rotation speed Z1 of the first roller;

a second measuring device configured to measure a rotation speed Z2 of the second roller; and a controller configured to control an operation of transporting the sheet with the rotations of the first roller and the second roller, by controlling the first driving device and the second driving device, the controller including:

a first estimating unit configured to estimate a value R1 related to a reaction force which acts on the first roller in a case that the first roller is driven to rotate by the first driving device;

a second estimating unit configured to estimate a value R2 related to a reaction force which acts on the second roller in a case that the second roller is driven to rotate by the second drive device;

a first calculating unit configured to calculate a control input U1 in accordance with a deviation between a target speed, and a speed of the sheet (Z1+Z2)/2 corresponding to the sum (Z1+Z2) of the rotation speed Z1 measured by the first measuring device and the rotation speed Z2 measured by the second measuring device;

a second calculating unit configured to calculate a control input U2 in accordance with a deviation between a target value, and a value (R1−R2)/2 corresponding to the difference (R1−R2) between the value R1 estimated by the first estimating unit and the value R2 estimated by the second estimating unit;

a first drive controller configured to input, to the first driving device, a control signal in accordance with the sum (U1+U2) of the control input U1 and the control input U2; and a second drive controller configured to input, to the second driving device, a control signal in accordance with the difference (U1−U2) between the control input U1 and the control input U2.

When ink droplets are jetted from a jetting portion of the image forming device to form images on the sheet, if the tension of the sheet cannot be controlled, then a change in flexure of the sheet may cause a deviation in the landing points of the ink droplets, and thereby the quality of the images formed on the sheet may be deteriorated. In contrast to this, according to the image forming system of the present teaching, because the sheet can be transported with an appropriate tension, it is possible to suppress the degradation in image quality caused by the flexure.

According to a third aspect of the present teaching, there is provided a controller controlling an operation of transporting a sheet by controlling a first driving device which drives a first roller to rotate and a second driving device which drives a second roller to rotate, in a transport mechanism performing the operation of transporting the sheet by rotating the first roller and the second roller which are arranged apart from each other along a transporting path of the sheet, the controller including:

a first estimating unit configured to estimate a value R1 related to a reaction force which acts on the first roller in a case that the first roller is driven to rotate by the first driving device;

a second estimating unit configured to estimate a value R2 related to a reaction force which acts on the second roller in a case that the second roller is driven to rotate by the second driving device;

a first calculating unit configured to calculate a control input U1 in accordance with a deviation between a target state quantity, and a state quantity of the sheet (Z1+Z2)/2 corresponding to the sum (Z1+Z2) of a state quantity Z1 and a state quantity Z2, by using the state quantity Z1 concerning a rotary motion of the first roller, and the state quantity Z2 concerning a rotary motion of the second roller, the state quantities Z1 and Z2 being measured by a measuring device;

a second calculating unit configured to calculate a control input U2 in accordance with a deviation between a target value, and a value (R1−R2)/2 corresponding to the difference (R1−R2) between the value R1 estimated by the first estimating unit and the value R2 estimated by the second estimating unit;

a first drive controller configured to input, to the first driving device, a control signal in accordance with the sum (U1+U2) of the control input U1 and the control input U2; and a second drive controller configured to input, to the second driving device, a control signal in accordance with the difference (U1−U2) between the control input U1 and the control input U2.

BRIEF DESCRIPTION OF THE DRAWINGS

FIG. 8 shows a configuration of a table defining the target tension; and

DESCRIPTION OF THE PREFERRED EMBODIMENT

Hereinbelow, referring to the accompanying drawings, an embodiment of the present teaching will be explained.

Figure 1:
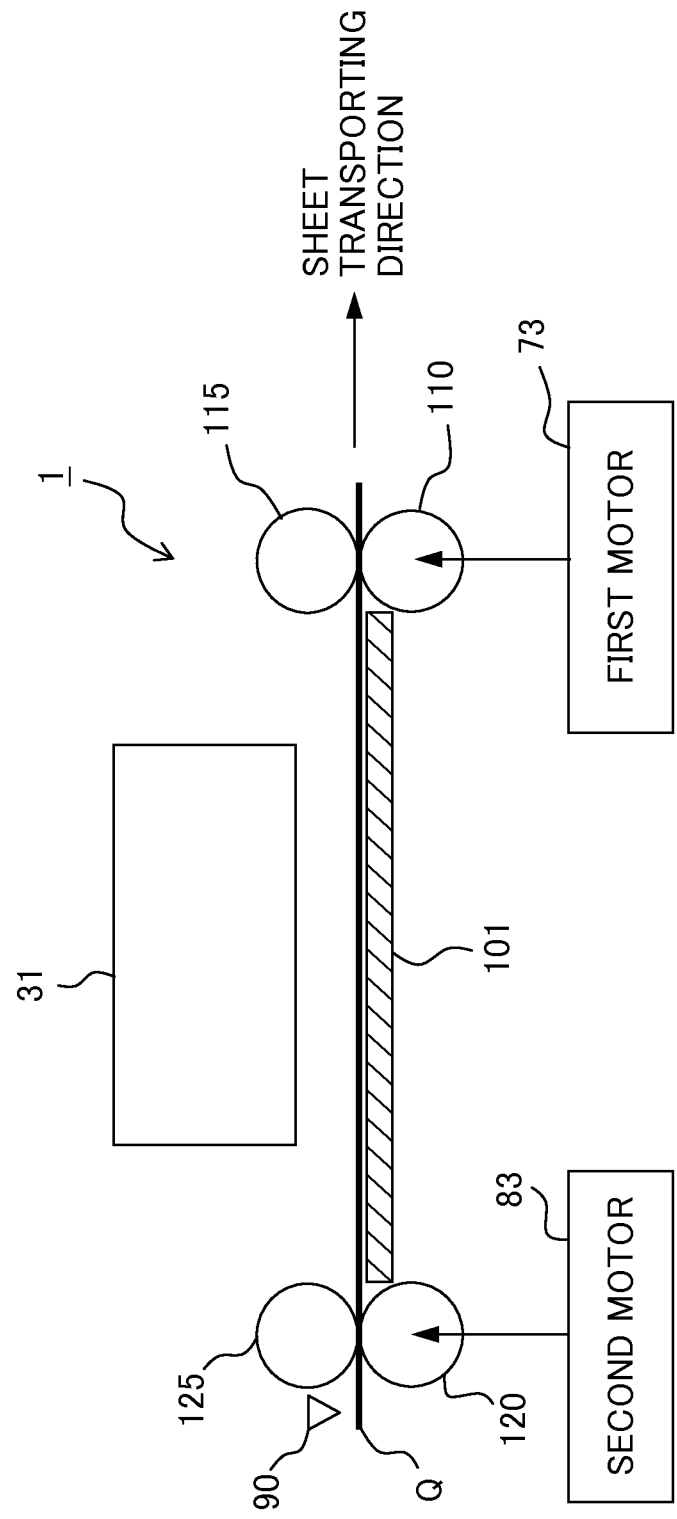
FIG. 1 shows a configuration of the periphery of a sheet transporting path in an image forming system.

An image forming system 1 of this embodiment is formed as an ink jet printer. As shown in FIG. 1, this image forming system 1 includes an ink jet head 31 positioned above a platen 101 constituting a transporting path for the sheet Q. The ink jet head 31 includes a nozzle group (not shown) on the lower surface to jet ink droplets toward the sheet Q passing through over the platen 101. By this jetting operation, the ink jet head 31 forms images on the sheet Q.

The ink jet head 31 has such a shape as elongated in a line direction (the normal direction of FIG. 1, that is, the direction perpendicular to the page of FIG. 1), and has such a configuration as capable of forming images simultaneously in the line direction on the entire area of the sheet Q passing through over the platen 101.

A currently widespread ink jet printer forms an image in the line direction by causing the ink jet head to jet ink droplets while moving the ink jet head in the line direction at a constant speed with the sheet Q standing still. After forming the image, the ink jet printer sends the sheet Q by a predetermined quantity or length to the downstream side. By repetitively carrying out such kind of operation, images are formed while transporting the sheet Q intermittently.

In contrast to this, the image forming system 1 of this embodiment does not transport the sheet Q intermittently and forms images on the sheet Q by jetting ink droplets from the ink jet head 31 elongated in the line direction while transporting the sheet Q at a constant speed in a transporting direction. Thus, the image forming system 1 of this embodiment differs from the well-known ink jet printer mentioned above in that images are formed by jetting ink droplets on the sheet Q while transporting the sheet Q at a constant speed.

In the image forming system 1, the sheet Q is transported from the upstream side to the downstream side of the transporting path along the platen 101 by the rotations of a first roller 110 and a second roller 120. The first roller 110 is provided on the downstream side of the platen 101, and arranged to face a first driven roller 115. The second roller 120 is provided on the upstream side of the platen 101, and arranged to face a second driven roller 125.

The first roller 110 transports the sheet Q to the downstream side by its rotation with the sheet Q being pinched between itself and the opposite first driven roller 115. The first roller 110 is driven to rotate by a first motor 73 which is a DC motor. On the other hand, the second roller 120 transports the sheet Q to the downstream side by its rotation with the sheet Q being pinched between itself and the opposite second driven roller 125. The second roller 120 is driven to rotate by a second motor 83 which is a DC motor in the same manner as the first motor 73.

That is, in the image forming system 1, the sheet Q is supported at two points at intervals along the transporting direction, by the first roller 110 and the second roller 120 which are arranged apart from each other across the platen 101 along the transporting path. In this state, the sheet Q is transported to the downstream side by driving the first motor 73 and second motor 83 to operate.

The image forming system 1 drives the first motor 73 and second motor 83 to operate from a stage prior to supplying the sheet Q to the second roller 120, to rotate the first roller 110 and second roller 120 at a constant speed. Then, with the first roller 110 and second roller 120 rotating at the constant speed, the sheet Q is supplied from the upstream side of the second roller 120 to the second roller 120. That is, the first motor 73 and second motor 83 operate from the point of time when image formation is ordered, so as to rotate the first roller 110 and second roller 120 at the constant speed from a time when the sheet Q is not yet present on the rollers.

Figure 2:
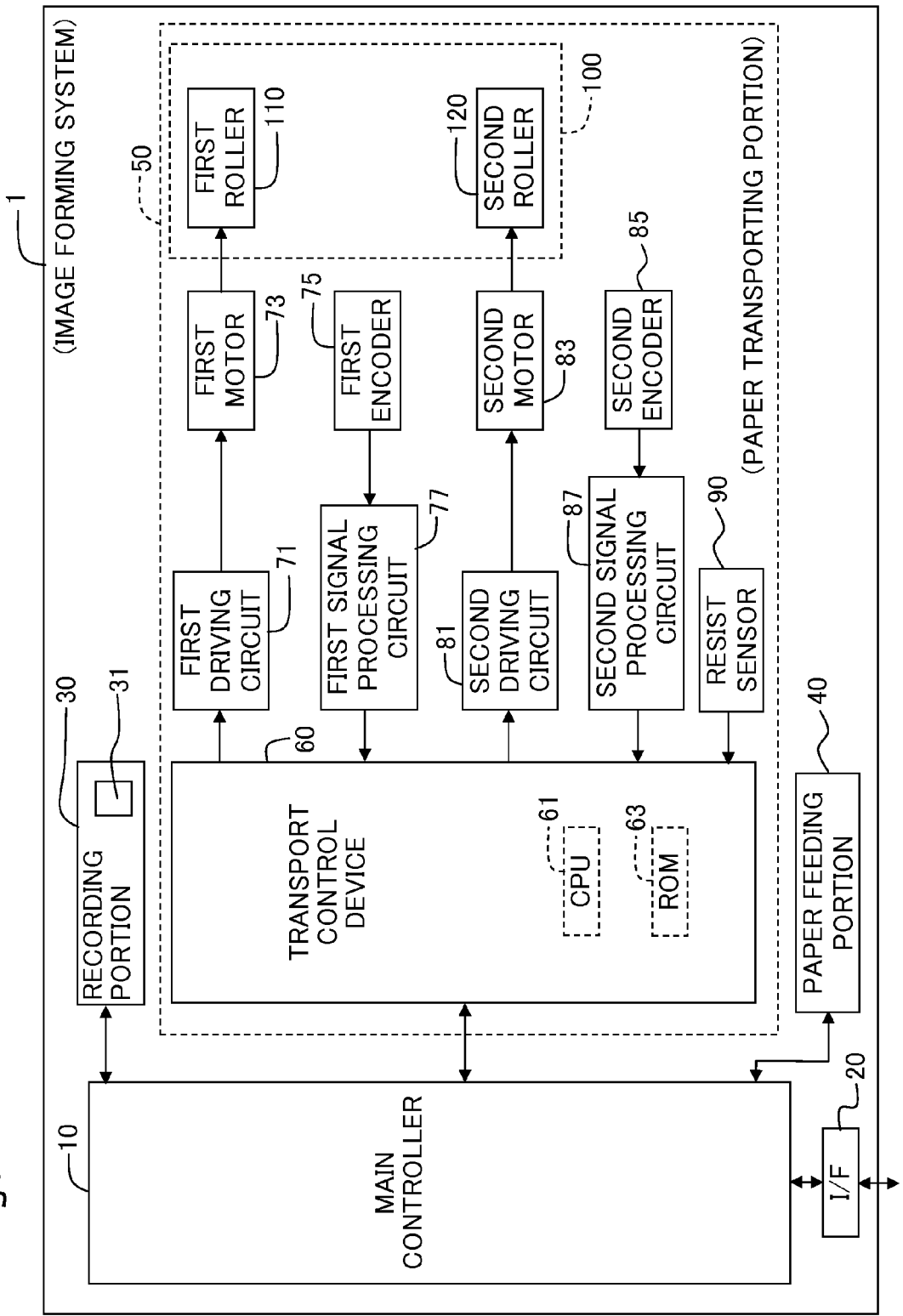
FIG. 2 is a block diagram showing a general configuration of the image forming system.

Next, a detailed configuration of the image forming system 1 will be explained. As shown in FIG. 2, the image forming system 1 includes a main controller 10, a communication interface 20, a recording portion 30, a paper feeding portion (a sheet feeding portion) 40, and a paper transporting portion (a sheet transporting portion) 50. A transporting mechanism 100 for the sheet Q, which includes the aforementioned first roller 110 with first driven roller 115, second roller 120 with second driven roller 125, and the platen 101 is provided in the paper transporting portion 50.

The main controller 10 includes an unshown microcomputer, etc., to control the image forming system 1 as a whole. The communication interface 20 serves to realize the communications between the main controller 10 and external devices (personal computers, etc.).

The main controller 10 receives the image data of a printing object from an external device via the communication interface 20, and controls the recording portion 30, paper feeding portion 40, and paper transporting portion 50 such that images based on the image data of the printing object is formed on the sheet Q.

The recording portion 30 primarily includes the aforementioned ink jet head 31, and a driving circuit therefor (not shown). Based on an instruction from the main controller 10, the recording portion 30 drives the ink jet head 31 to form the images on the sheet Q based on the image data of the printing object.

The paper feeding portion 40 is the part of supplying the sheet Q from the upstream side of the transporting path to the second roller 120, and includes a motor, a paper feeding roller (a sheet feeding roller), a paper feeding tray (a sheet feeding tray), and the like which are all not shown. Based on an instruction from the main controller 10, the paper feeding portion 40 supplies the sheet Q to the second roller 120.

Other than the transporting mechanism 100, the paper transporting portion 50 includes a transport control device 60, a first driving circuit 71, the first motor 73, a first encoder 75, a first signal processing circuit 77, a second driving circuit 81, the second motor 83, a second encoder 85, a second signal processing circuit 87, and a resist sensor 90.

The first driving circuit 71 serves to drive the first motor 73 by a driving current corresponding to the duty ratio of a PWM signal, according to the PWM signal as a control signal inputted from the transport control device 60. The first driving circuit 71 drives the first motor 73 to operate so as to drive the first roller 110 to rotate.

The first encoder 75 is a rotary encoder provided to output pulse signals each time the first roller 110 rotates through a predetermined angle. The first encoder 75 is provided at such a position as able to observe the rotary motion of the first roller 110 directly or indirectly. For example, the first encoder 75 is arranged such that the rotating shaft of its grating disk (not shown) may conform to the rotating shaft of the first roller 110 or the rotating shaft of the first motor 73. Like a well-known rotary encoder, the first encoder 75 outputs, as the pulse signals mentioned above, an A-phase signal and a B-phase signal which are different in phase from each other. Hereinbelow, these signals will be expressed collectively as an encoder signal.

The encoder signal outputted from the first encoder 75 is inputted to the first signal processing circuit 77. Based on this encoder signal, the first signal processing circuit 77 measures a rotation amount X1 and a rotation speed V1 of the first roller 110, and inputs information of the measured rotation amount X1 and rotation speed V1 to the transport control device 60.

The second driving circuit 81 serves to drive the second motor 83 by a driving current corresponding to the duty ratio of another PWM signal, according to the PWM signal inputted from the transport control device 60. The second driving circuit 81 drives the second motor 83 to operate so as to drive the second roller 120 to rotate.

The second encoder 85 is another rotary encoder provided to output pulse signals each time the second roller 120 rotates through a predetermined angle. Like the first encoder 75, the second encoder 85 is provided at such a position as able to observe the rotary motion of the second roller 120 directly or indirectly. Further, the second encoder 85 also outputs, as the pulse signals mentioned above, an A-phase signal and a B-phase signal which are different in phase from each other.

The encoder signal outputted from the second encoder 85 (i.e., the A-phase signal and B-phase signal) is inputted to the second signal processing circuit 87. Based on this encoder signal, the second signal processing circuit 87 measures a rotation amount X2 and a rotation speed V2 of the second roller 120, and inputs information of the measured rotation amount X2 and rotation speed V2 to the transport control device 60.

The resist sensor 90 serves to detect whether or not the sheet Q has passed. As shown in FIG. 1, the resist sensor 90 is provided in the vicinity of the second roller 120 on the upstream side of the second roller 120 to input, to the transport control device 60, a signal indicating that the sheet Q has passed the point sensed by the resist sensor 90.

The transport control device 60 controls the first motor 73 and second motor 83. The transport control device 60 calculates a control input for the first motor 73 (an aftermentioned first control input Us), and a control input for the second motor 83 (an aftermentioned second control input Ud), and inputs PWM signals corresponding to those control inputs to the first driving circuit 71 and the second driving circuit 81, respectively. By controlling the first motor 73 and second motor 83 in this manner, the transport control device 60 controls the operation of transporting the sheet Q realized by the rotations of the first roller 110 and the second roller 120.

In particular, the transport control device 60 controls the first motor 73 and second motor 83 such that the sheet Q may be transported at a constant speed over the platen 101. Further, the transport control device 60 controls the first motor 73 and second motor 83 such that the sheet Q may be transported with an appropriate tension when the sheet Q is transported while receiving forces from both the first roller 110 and the second roller 120.

Figure 3:
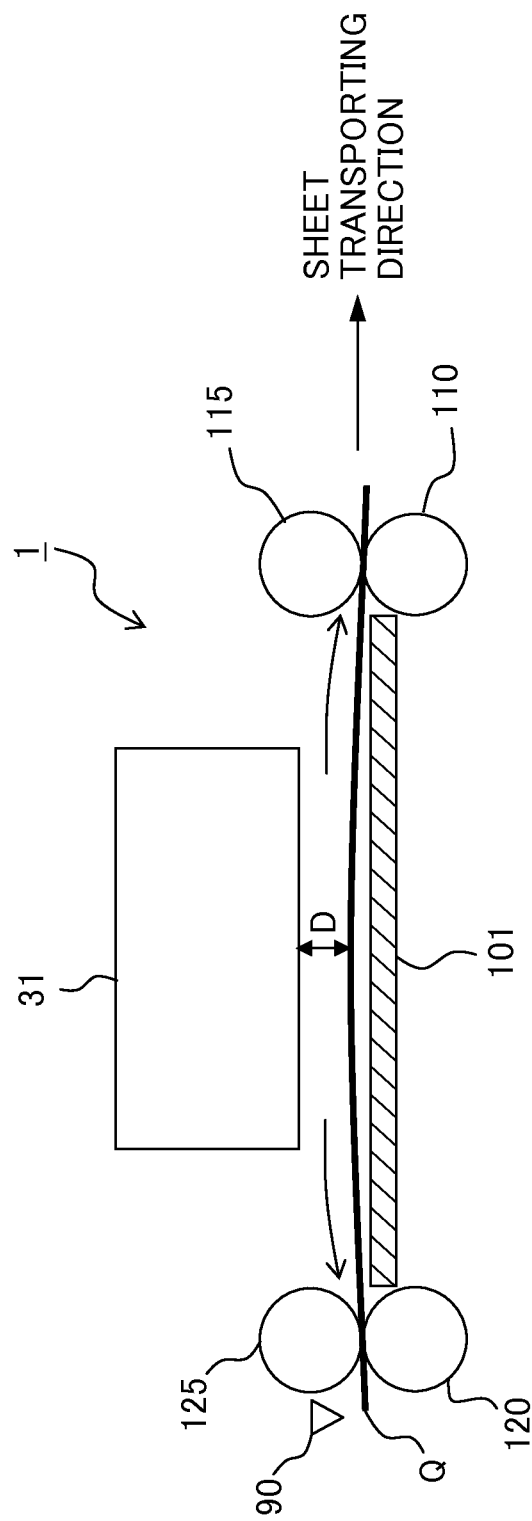
FIG. 3 shows a change in the distance between the lower surface of an ink jet head and the surface of a sheet, due to flexure of the sheet.

The following is the reason for carrying out such a motor control taking the tension into consideration in the image forming system 1 of this embodiment. According to this embodiment, the individual motors 73 and 83 are used respectively to drive the first roller 110 and second roller 120 to rotate. Therefore, when carrying out a motor control without taking the tension into consideration, a deviation between the rotary motion of the first roller 110 and the rotary motion of the second roller 120 can occur due to some control error, and then the sheet Q may be flexed over the platen 101 as shown in FIG. 3. Moreover, because the flexure is not definite, there may be a change with time in the distance D between the lower surface of the ink jet head 31, and the (upper) surface of the sheet Q.

In this embodiment, while transporting the sheet Q at a constant speed, ink droplets are jetted from the ink jet head 31. Therefore, if the distance D changes with time, then the landing points of the ink droplets jetted from the ink jet head 31 will deviate from the intended points on the sheet Q. Such deviation of the landing points negatively affects the quality of the images formed on the sheet Q.

Because of this reason, the transport control device 60 in this embodiment controls the first motor 73 and second motor 83 so as to control both the speed and the tension of the sheet Q.

Figure 4:
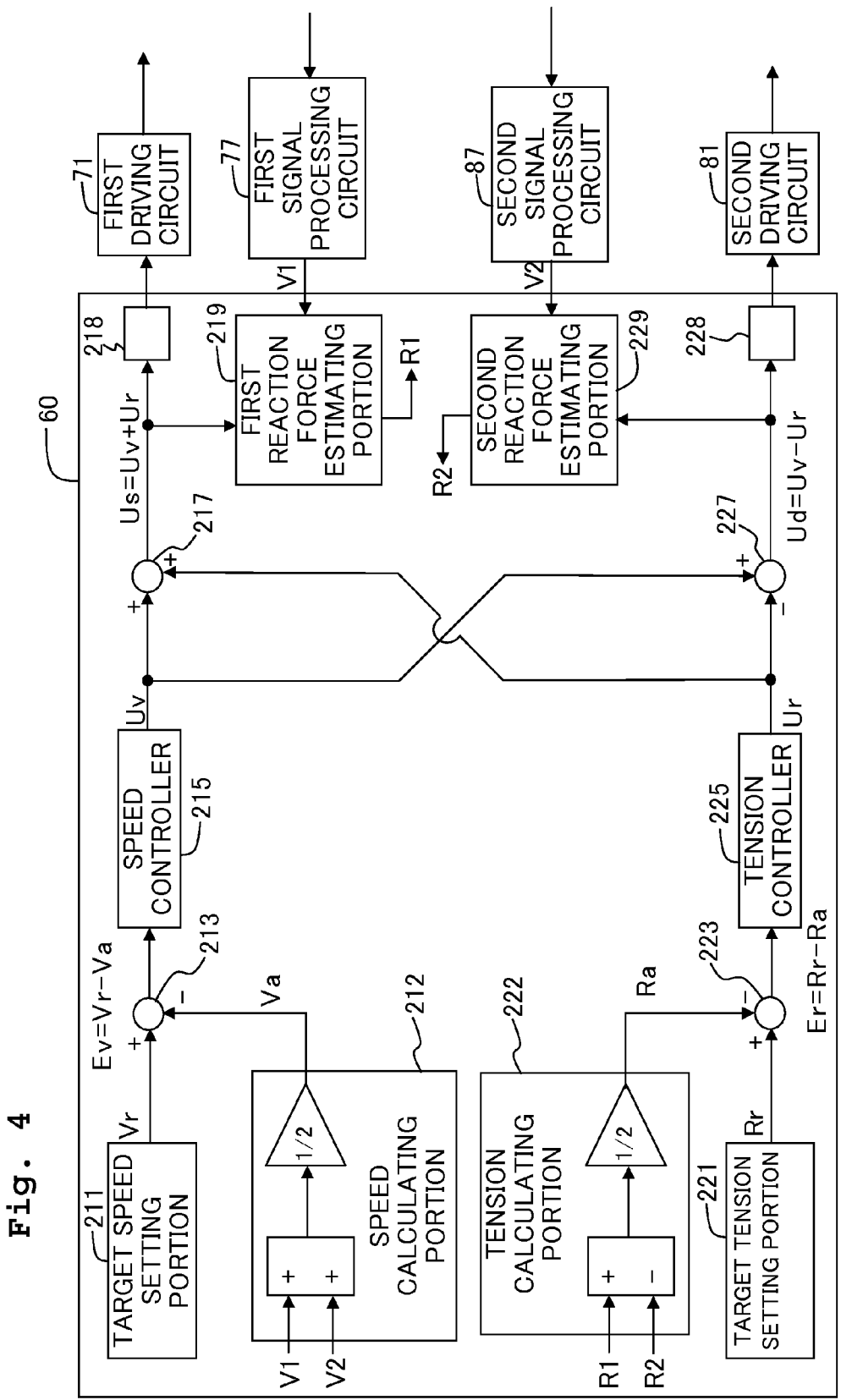
FIG. 4 is a block diagram showing a detailed configuration of a transport control device.

Next, a detailed configuration of the transport control device 60 will be explained. As shown in FIG. 4, the transport control device 60 includes a target speed setting portion 211, a speed calculating portion 212, a speed deviation calculating portion 213, a speed controller 215, a first control input calculating portion 217, a first PWM signal generating portion 218, and a first reaction force estimating portion 219. The transport control device 60 further includes a target tension setting portion 221, a tension calculating portion 222, a tension deviation calculating portion 223, a tension controller 225, a second control input calculating portion 227, a second PWM signal generating portion 228, and a second reaction force estimating portion 229.

The target speed setting portion 211 sets a target speed Vr for the sheet Q. In particular, the target speed setting portion 211 sets a fixed value as the target speed Vr for each point of time such that the sheet Q may be transported at a constant speed in the course of transporting the sheet Q.

The speed calculating portion 212 calculates the average rotation speed (V1+V2)/2 of the first roller 110 and second roller 120, which is the average value of the rotation speed V1 measured by the first signal processing circuit 77, and the rotation speed V2 measured by the second signal processing circuit 87, as the speed Va of the sheet Q.

The speed deviation calculating portion 213 calculates a deviation Ev (=Vr−Va) between the target speed Vr set by the target speed setting portion 211, and the speed Va calculated by the speed calculating portion 212.

The speed controller 215 calculates a control input Uv corresponding to the deviation Ev according to a predetermined transfer function G obtained on the basis of a transfer model of a control object. The control input Uv is a control input for controlling the speed Va of the sheet Q to be at the target speed Vr.

The control object mentioned here is the sum of a first control object and a second control object, and the transfer function G is based on the transfer model corresponding to the sum of the first control object and the second control object. The first control object is the first driving circuit 71, first motor 73, first roller 110, first encoder 75, and first signal processing circuit 77. The second control object is the second driving circuit 81, second motor 83, second roller 120, second encoder 85, and second signal processing circuit 87.

The speed controller 215 calculates the control input Uv according to the transfer function G such that the speed Va of the sheet Q may pursue or follow the target speed Vr. In particular, it calculates the driving current, as the control input Uv, which should be applied to the first motor 73 and second motor 83 for realizing the target speed Vr.

The target tension setting portion 221 sets a target tension Rr for the sheet Q. Leaving the details to a later description, the target tension setting portion 221 sets a nonzero target tension Rr such that the sheet Q may be transported with an appropriate tension when both the first roller 110 and the second roller 120 transport the sheet Q.

The tension calculating portion 222 calculates the value (R1−R2)/2, which corresponds to the difference (R1−R2) between a reaction force R1 estimated by the first reaction force estimating portion 219, and a reaction force R2 estimated by the second reaction force estimating portion 229, as the tension Ra of the sheet Q.

The first reaction force estimating portion 219 estimates the reaction force R1 acting on the first roller 110 when it is driven to rotate by the first motor 73, while the second reaction force estimating portion 229 estimates the reaction force R2 acting on the second roller 120 when it is driven to rotate by the second motor 83. However, the reaction forces R1 and R2 take on positive or negative values according to the direction of the acting force. For example, it is possible to suppose that if a reaction force acts in the opposite direction to the transporting direction of the sheet Q, then the reaction force takes on a positive value, whereas if a reaction force acts in the same direction as the transporting direction of the sheet Q, then the reaction force takes on a negative value.

The tension deviation calculating portion 223 calculates a deviation Er (=Rr−Ra) between the target tension Rr set by the target tension setting portion 221, and the tension Ra calculated by the tension calculating portion 222.

The tension controller 225 calculates a control input Ur corresponding to the deviation Er according to a predetermined transfer function H obtained on the basis of a transfer model of a control object. The control input Ur is a control input for controlling the tension Ra of the sheet Q to be at the target tension Rr.

The control object mentioned here is the difference between the first control object and the second control object, and the transfer function H is based on the transfer model corresponding to the difference between the first control object and the second control object.

The tension controller 225 calculates the control input Ur according to the transfer function H such that the tension Ra of the sheet Q may pursue or follow the target tension Rr. In particular, it calculates the driving current, as the control input Ur, which should be applied to the first motor 73 and second motor 83 for realizing the target tension Rr.

The first control input calculating portion 217 calculates, as the first control input Us, the sum (Uv+Ur) of the control input Uv calculated by the speed controller 215, and the control input Ur calculated by the tension controller 225. The first control input Us (=Uv+Ur) corresponds to the control input for the first motor 73, in other words, the electric-current command value for the first driving circuit 71.

The second control input calculating portion 227 calculates, as the second control input Ud, the difference (Uv−Ur) between the control input Uv calculated by the speed controller 215, and the control input Ur calculated by the tension controller 225. The second control input Ud (=Uv−Ur) corresponds to the control input for the second motor 83, in other words, the electric-current command value for the second driving circuit 81.

Hereinbelow, an explanation will be made on the reason why the transport control device 60 calculates the sum of the control input Uv and the control input Ur as the first control input Us, and calculates the difference between the control input Uv and the control input Ur as the second control input Ud.

In order to generate a tension in the sheet Q, it is necessary to adjust the driving current to the first motor 73 such that a force greater than the force needed for speed control by the amount of the tension may act on the first roller 110 from the first motor 73. On the other hand, because the tension applies a negative reaction force to the second roller 120 to pull the second roller 120 in the transporting direction, it is necessary for the second motor 83 to adjust the driving current such that a force smaller than the force originally needed for speed control by the amount of the tension may act on the second roller 120 from the second motor 83. For this reason, the transport control device 60 calculates the sum of the control input Uv and the control input Ur as the first control input Us, and calculates the difference between the control input Uv and the control input Ur as the second control input Ud.

The first PWM signal generating portion 218 generates a PWM signal having the duty ratio to drive the first motor 73 by the driving current corresponding to the first control input Us calculated in the above manner, and inputs the same to the first driving circuit 71. According to this PWM signal, the first driving circuit 71 drives the first motor 73 by the driving current corresponding to the first control input Us.

The second PWM signal generating portion 228 generates a PWM signal having the duty ratio to drive the second motor 83 by the driving current corresponding to the second control input Ud, and inputs the same to the second driving circuit 81. According to this PWM signal, the second driving circuit 81 drives the second motor 83 by the driving current corresponding to the second control input Ud.

Further, the first reaction force estimating portion 219 estimates the reaction force R1 acting on the first motor 73 based on the first control input Us calculated by the first control input calculating portion 217, and the rotation speed V1 measured by the first signal processing circuit 77. On the other hand, the second reaction force estimating portion 229 estimates the reaction force R2 acting on the second motor 83 based on the second control input Ud calculated by the second control input calculating portion 227, and the rotation speed V2 measured by the second signal processing circuit 87.

Hereinbelow, an explanation will be given about detailed configurations of the first reaction force estimating portion 219 and the second reaction force estimating portion 229. However, the first reaction force estimating portion 219 and the second reaction force estimating portion 229 respectively estimate the reaction forces R1 and R2 using an identical principle. Therefore, in the following description, the detailed configuration of the first reaction force estimating portion 219 will be explained as the representative. The second reaction force estimating portion 229 estimates the reaction force R2 using the same principle as the first reaction force estimating portion 219, while using the second control input Ud and the rotation speed V2, instead of the first control input Us and the rotation speed V1.

Figure 5:
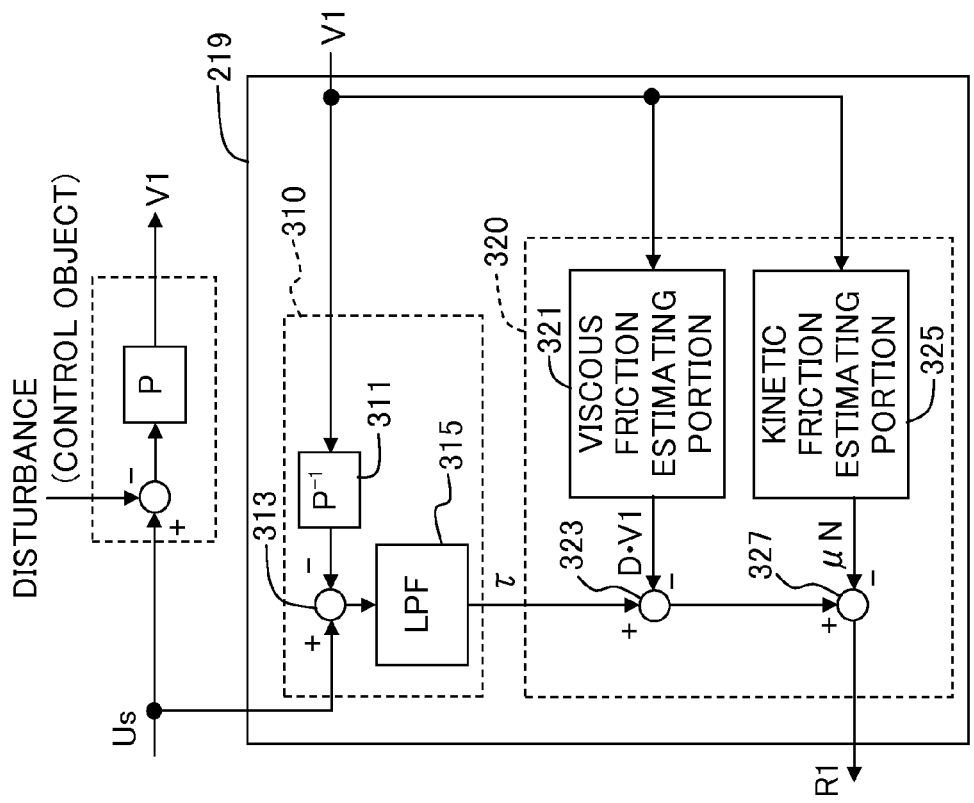
FIG. 5 is a block diagram showing a configuration of a first reaction force estimating portion.

As shown in FIG. 5, the first reaction force estimating portion 219 includes a disturbance observer 310 and an estimating portion 320. As is well known, the disturbance observer 310 estimates disturbance acting on the control object. The disturbance observer 310 includes an inverse model computing portion 311, a subtractor 313, and a low-pass filter (LPF) 315.

The inverse model computing portion 311 converts the rotation speed V1 measured by the first signal processing circuit 77 into the corresponding control input U* by using a transfer function $P^{-1}$ of the inverse model corresponding to the transfer model of the aforementioned first control object. The subtractor 313 calculates the deviation (Us−U*) between the first control input Us inputted to the first motor 73, and the control input U* corresponding to the rotation speed V1 and calculated by the inverse model computing portion 311.

The low-pass filter 315 removes the high-frequency component from the deviation (Us−U*). The disturbance observer 310 outputs the deviation (Us−U*) from which the high-frequency component has been removed by the low-pass filter 315 as a disturbance estimated value τ.

Considering that the first control input Us is an electric-current command value, let the unit of the deviation (Us−U*) be ampere. Here, with a DC motor, a proportional relation is established between the electric current (ampere) flowing through the DC motor and the torque (reaction force) of the DC motor. Hence, the deviation (Us−U*) indirectly indicates a force acting on the control object (which is here the first roller 110 or the first motor 73) as disturbance.

Based on the disturbance estimated value τ, the estimating portion 320 estimates the reaction force R1 caused by the tension of the sheet Q. The disturbance estimated value τ includes not only the reaction force component caused by the tension, but also a viscous friction component and a kinetic friction component brought about by the rotation. Hence, the estimating portion 320 estimates the reaction force R1 by removing the viscous friction component and kinetic friction component from the disturbance estimated value τ.

In particular, as a configuration for removing the viscous friction component from the disturbance estimated value τ, the estimating portion 320 includes a viscous friction estimating portion 321 and a subtractor 323. The viscous friction estimating portion 321 sets, as the estimated value of the viscous friction force, the value (D×V1), which is obtained by multiplying the rotation speed V1 measured by the first signal processing circuit 77 by a predetermined coefficient D. The subtractor 323 calculates the disturbance estimated value after removing the viscous friction component τ1=(τ−D×V1), by subtracting the estimated value of the viscous friction force (D×V1) from the disturbance estimated value τ.

Further, as a configuration for removing the kinetic friction component from the disturbance estimated value τ, the estimating portion 320 includes a kinetic friction estimating portion 325 and a subtractor 327. If the rotation speed V1 measured by the first signal processing circuit 77 is zero, then the kinetic friction estimating portion 325 sets zero as the estimated value of the kinetic friction force, whereas if the rotation speed V1 measured by the first signal processing circuit 77 is not zero, then the kinetic friction estimating portion 325 sets a predetermined nonzero value μN as the estimated value of the kinetic friction force. The subtractor 327 subtracts the estimated value of the kinetic friction force (zero or μN) set by the kinetic friction estimating portion 325 from the disturbance estimated value τ1. The estimating portion 320 takes this value calculated by the subtractor 327 as the estimated value of the reaction force R1 acting on the first roller 110. Further, the second reaction force estimating portion 229 converts the rotation speed V2 measured by the second signal processing circuit 87 into the corresponding control input U* by using the transfer function $P^{-1}$ of the inverse model corresponding to the transfer model of the aforementioned first control object. On the other hand, in order to estimate the viscous friction force, and to estimate the kinetic friction force, a predetermined coefficient and a predetermined value each corresponding to the second control object are used.

Figure 6:
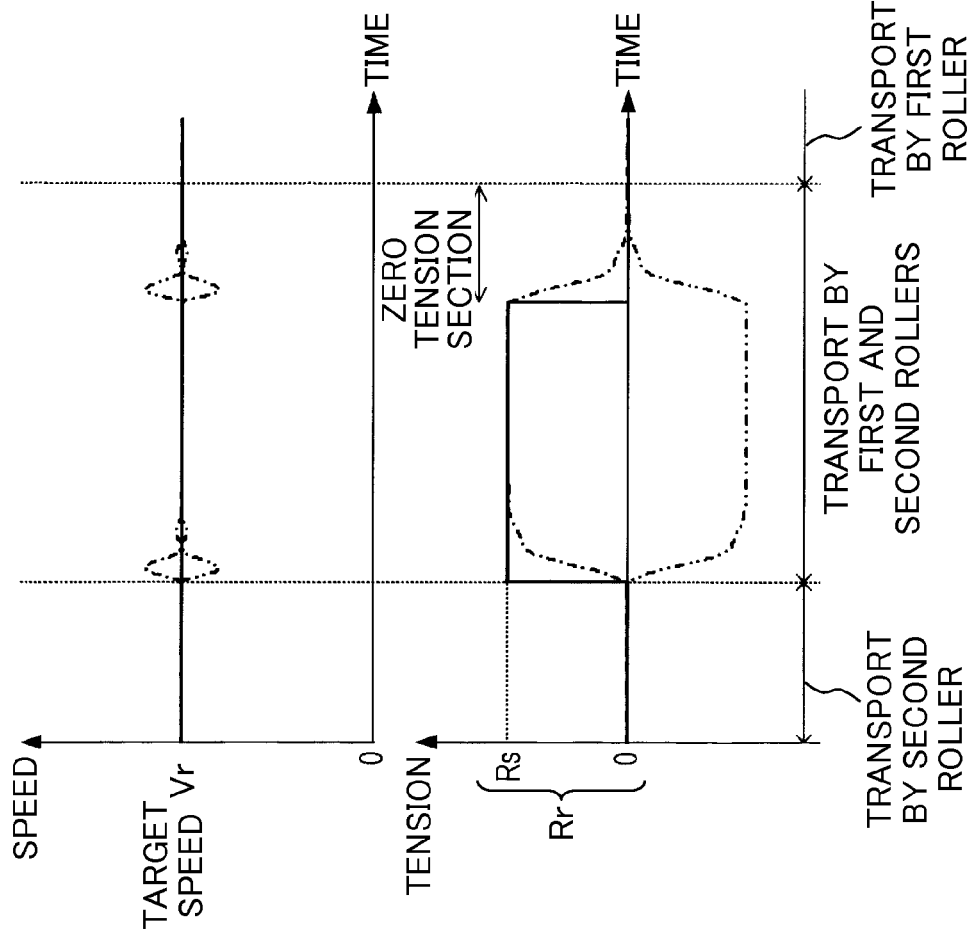
FIG. 6 is a graph (a first example) showing changes in target speed and target tension along with changes in observed speed and tension.

Next, an explanation will be given about an operation of setting the target tension Rr by the target tension setting portion 221. As shown in FIG. 6, the target tension setting portion 221 sets, as the target tension Rr at each point of time, a value according to the progression of transport of the sheet. That is, if the sheet Q is transported by both the first roller 110 and the second roller 120, then basically a nonzero specific value Rs is set as the target tension Rr, whereas if the sheet Q is transported by only one of the first roller 110 and the second roller 120, then zero is set as the target tension Rr.

As a graph of time versus tension, the lower-part graph of FIG. 6 shows a change in the target tension Rr with time by the solid line. Further, the lower-part graph shows the reaction force R1 acting on the first roller 110 by the one-dot chain line, and shows the reaction force R2 acting on the second roller 120 by the two-dot chain line. On the other hand, the upper-part graph of FIG. 6 is a graph of time versus speed. This graph shows the rotation speed V1 of the first roller 110 and the rotation speed V2 of the second roller 120, each of which is obtained when the target tension Rr is set as shown in the lower-part graph. The rotation speed V1 is represented by the one-dot chain line and the rotation speed V2 is represented by the two-dot chain line. Further, the upper-part graph shows the target speed Vr set by the target speed setting portion 211 by the solid line.

As described above, the tension of the sheet Q is controlled for the purpose of suppressing flexure of the sheet Q caused by the deviation between the rotary motion of the first roller 110 and the rotary motion of the second roller 120. Therefore, if the sheet Q is transported by both the first roller 110 and the second roller 120, it is basically desirable to set the target tension Rr to a nonzero value such that the sheet Q may be transported with an appropriate tension.

However, even if the target tension Rr is changed to zero, it is still not necessarily true that flexure will immediately occur with the sheet Q due to follow-up performance of the control. Further, if the target tension Rr is changed to zero at the point of time of shifting the sheet Q from the state of being transported by both the first roller 110 and the second roller 120 to the state of being transported by only the first roller 110, then at the point of time of shifting to the state of being transported by only the first roller 110, even though no tension is generated in reality, the control inputs Us and Ud serving to generate tension in the sheet Q are still calculated.

Figure 9:
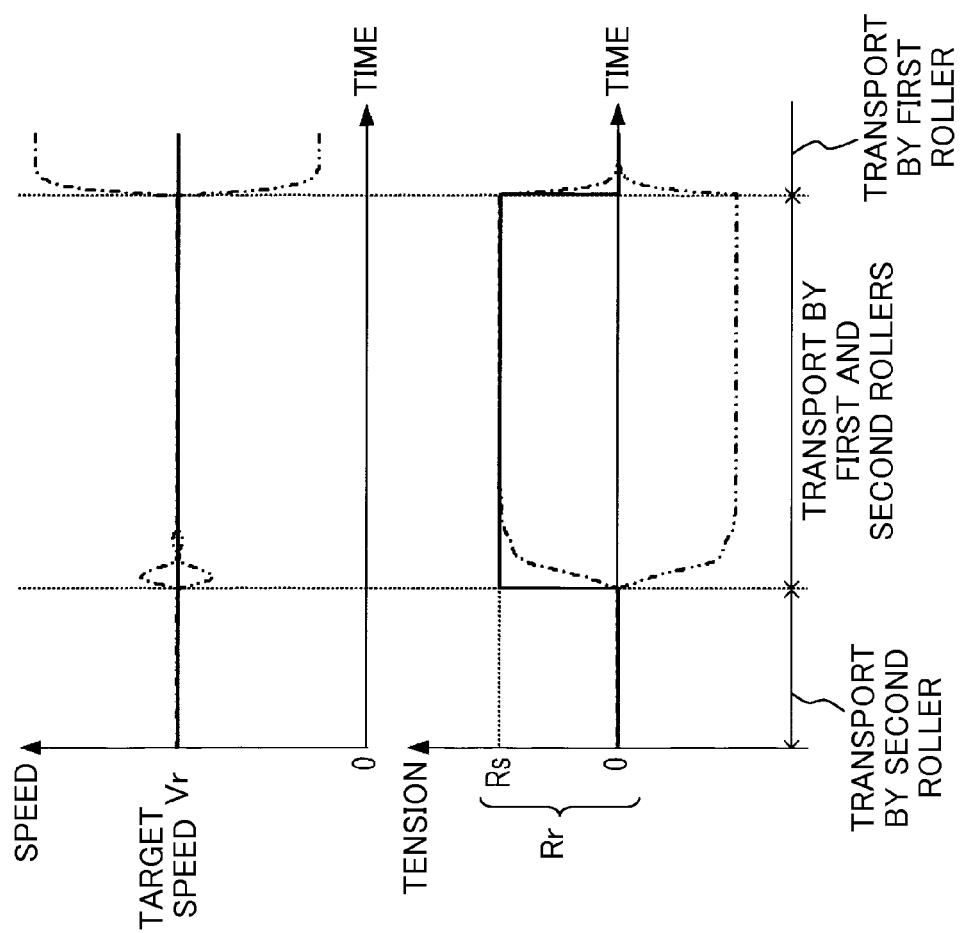
FIG. 9 is another graph (a second example) showing changes in the target speed and target tension along with changes in the observed speed and tension.

Therefore, when the target tension Rr is changed in such kind of manner, as shown in FIG. 9, there is an increase in the control error of the rotation speeds V1 and V2, immediately after the sheet Q is shifted to the state of being transported by only the first roller 110. The upper-part graph of FIG. 9 shows the rotation speeds V1 and V2 when the target tension Rr is changed to zero at the time of shifting the sheet Q to the state of being transported by only the first roller 110 from the state of being transported by both the first roller 110 and the second roller 120. Further, the lower-part graph shows the reaction forces R1 and R2 (estimated values) in this case. The objects, which are represented by the solid lines, one-dot chain lines and two-dot chain lines drawn in the graph of FIG. 9, are the same as those in FIG. 6.

In this embodiment, therefore, within the section where the sheet Q is transported by both the first roller 110 and the second roller 120, a section in which the target tension Rr is set to zero is defined (to be referred to below as the zero tension section). That is, in this embodiment, as shown in FIG. 6, the target tension Rr is changed to zero from a nonzero specific value Rs at a point of time prior to shifting the sheet Q to the state of being transported by only the first roller 110 from the state of being transported by both the first roller 110 and the second roller 120.

Figure 7:
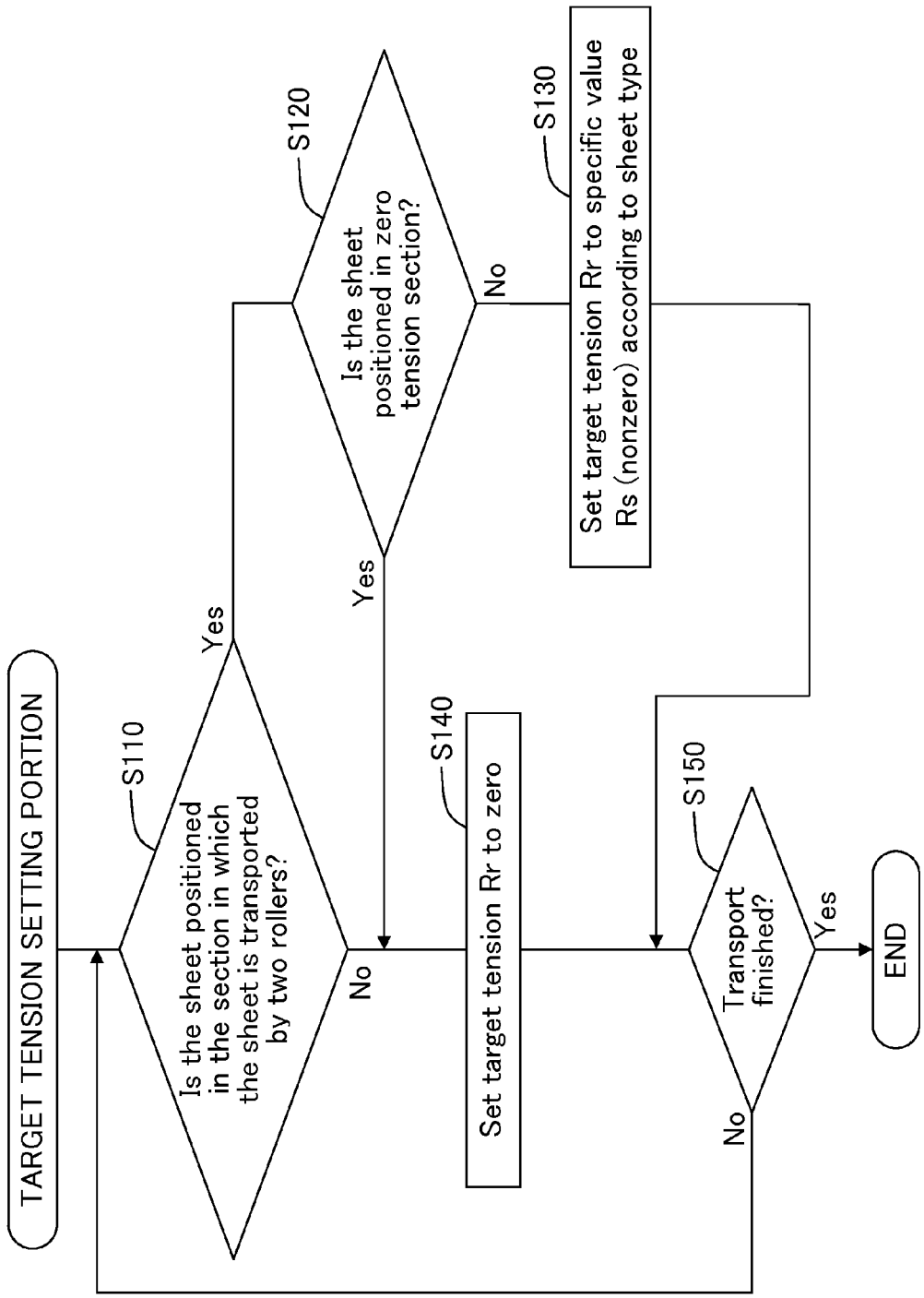
FIG. 7 is a flowchart of a process carried out by a target tension setting portion.

In particular, the target tension setting portion 221 carries out a process shown in FIG. 7 upon receiving an instruction from the main controller 10 to transport the sheet Q. In this process, the target tension setting portion 221 determines whether or not the sheet Q is situated at a position being transported by both the first roller 110 and the second roller 120 (S110).

It is possible to make this judgment based on the difference between the rotation amount X2 of the second roller 120 measured by the second signal processing circuit 87 at the point of time when the anterior end of the sheet Q is detected by the resist sensor 90, and the rotation amount X2 of the second roller 120 at the point of the present time. That is, the target tension setting portion 221 makes the judgment by specifying an amount L of transporting the sheet Q after the anterior end of the sheet Q comes to the second roller 120 based on the above difference.

If the target tension setting portion 221 judges that the sheet Q is not situated at the position where the sheet Q is transported by both the first roller 110 and the second roller 120 (No in S110), then the target tension setting portion 221 sets the target tension Rr to zero (S140), and then shifts the process to S150.

On the other hand, if the target tension setting portion 221 judges that the sheet Q is situated at the position where the sheet Q is transported by both the first roller 110 and the second roller 120 (Yes in S110), then it judges whether or not the sheet Q is situated in the predetermined zero tension section (S120).

The zero tension section is defined for each type of the sheet Q to be transported. The target tension setting portion 221 stores a table shown in FIG. 8 to define the target tension Rs and the zero tension section for each type of the sheet Q. According to the contents of this table, the target tension setting portion 221 specifies the zero tension section corresponding to the type of the sheet Q being currently transported, and judges whether or not the sheet Q is situated in the zero tension section.

The target tensions Rs stored in the table are determined by the designer as the optimum values of the target tension Rr in the section (excluding the zero tension section) where the sheet Q is transported by both the first roller 110 and the second roller 120. As examples of the optimum values, it is possible to take the maximum values of the tension without bringing about any slippage between the sheet Q and the rollers 110 and 120. This table has defined the target tension Rs and the zero tension section for each type of the sheet Q classified by, for example, the thickness, material or the like of the sheet Q.

As information for defining the zero tension section, the table stores a time Tc needed for the reaction forces R1 and R2, which are estimated respectively by the first reaction force estimating portion 219 and the second reaction force estimating portion 229, to converge at zero from the point of time of changing the target tension from a value Rs to zero. The length A of the zero tension section corresponds to the time Tc multiplied by the target speed Vr of the sheet Q, (Vr×Tc). That is, the zero tension section is defined as a section between the end point of the section where the sheet Q is transported by both the first roller 110 and the second roller 120, and the point located at the distance A upstream from that end point.

Therefore, the zero tension section is determined to be longer for a higher corresponding target tension Rs. According to such a method of setting the zero tension section, the target tension setting portion 221 changes the target tension Rr from a value Rs to zero at an earlier stage (on the further upstream side of the transporting path) for a higher target tension Rs.

In S120, the target tension setting portion 221 carries out the aforementioned judgment, for example, in the following manner. That is, based on the size of the sheet Q, the target tension setting portion 221 specifies an amount Le of transport of the sheet Q at the point of time when the sheet Q reaches the end point of the section where the sheet Q is transported by both the first roller 110 and the second roller 120. Then, if the present amount L of the transport of the sheet Q is not less than a threshold value (Le−A) which is the amount smaller than the transporting amount Le by the distance A, then the target tension setting portion 221 judges that the sheet Q is situated in the zero tension section. On the other hand, if the present amount L of the transport of the sheet Q is less than the threshold value (Le−A), then it judges that the sheet Q is not situated in the zero tension section.

Then, if the target tension setting portion 221 judges that the sheet Q is not situated in the zero tension section (No in S120), then based on the contents of the aforementioned table shown in FIG. 8, it sets the target tension Rr to a nonzero Rs corresponding to the type of the sheet Q being currently transported (S130), and then shifts the process to S150.

On the other hand, if the target tension setting portion 221 judges that the sheet Q is situated in the zero tension section (Yes in S120), then it sets the target tension Rr to zero, and then shifts the process to S150.

When the process is shifted to S150, the target tension setting portion 221 judges whether or not the sheet Q has been transported to a transporting-end position. Then, if the judgment result is negative (No in S150), then it shifts the process to S110.

The target tension setting portion 221 repetitively carries out the above process in this manner until the sheet Q reaches the transporting-end position and, when the sheet Q is finally transported to the transporting-end position (Yes in S150), the process shown in FIG. 7 is terminated, thereby finishing the transport of the sheet Q.

Hereinabove, the image forming system 1 of this embodiment is explained. According to this embodiment, the speed of the sheet Q is properly controlled according to the component Uv included in the first control input Us (=Uv+Ur) for the first motor 73, and in the second control input Ud (=Uv−Ur) for the second motor 83. Further, the tension of the sheet Q is properly controlled according to the component +Ur included in the first control input Us for the first motor 73, and the component −Ur included in the second control input Ud for the second motor 83.

That is, according to this embodiment, by controlling the first motor 73 and second motor 83 using the sum of, and the difference between, the control inputs Uv and Ur, it is possible to transport the sheet Q with the two rollers 110 and 120 while controlling the speed and tension of the sheet Q with high precision. As a result, according to this embodiment, it is possible to suppress any degradation in the quality of the images formed on the sheet Q caused by a change in flexure of the sheet Q, thereby enabling construction of the image forming system 1 capable of forming high-quality images on the sheet Q.

Especially, according to this embodiment, it is configured to change the target tension Rr from a nonzero value Rs to zero at a stage prior to shifting the sheet Q from the state of being transported by both the first roller 110 and the second roller 120 to the state of being transported by only the first roller 110. This is for suppressing the phenomenon that, in the shifting, the rotation speeds V1 and V2 are caused to deviate from the target speed Vr due to follow-up performance of the control (i.e., the delay of the estimated reaction forces R1 and R2). Hence, according to this embodiment, throughout the entire process of transporting the sheet Q, it is possible to carry out a proper speed control, thereby enabling formation of good-quality images on the sheet Q.

Further, in this embodiment, the values Rs of the target tension Rr and the zero tension section are changed according to the type of the sheet Q. Hence, it is possible to set an appropriate target tension and zero tension section in consideration of the thickness, surface slipperiness and the like of the sheet Q. Hence, according to this embodiment, it is possible to restrain any slippage from occurring between the sheet Q and the rollers 110 and 120 while transporting the sheet Q with an appropriate tension.

Other Embodiments

While an embodiment of the present teaching is explained above, the present teaching is not limited to the above embodiment, but can adopt various embodiments. For example, in the above embodiment, the rotation speeds V1 and V2 of the first roller 110 and the second roller 120 are measured as the state quantities concerning the rotary motion of the first roller 110 and second roller 120. Then, speed control of the sheet Q is carried out based on the measured values.

However, the image forming system 1 may also be configured to carry out position control of the sheet Q based on the rotation amounts X1 and X2 of the first roller 110 and the second roller 120 instead of the rotation speeds V1 and V2. Further, it is also possible to adopt a system configuration which carries out acceleration control of the sheet Q based on measured acceleration values of the first roller 110 and the second roller 120. Further, the technique concerning sheet transport is not limited to image forming systems, but applicable to various sheet transporting systems.

Further, in the above embodiment, the explanation is made for the image forming system 1 to set the target tension Rr along the solid line of the lower part of FIG. 6 (i.e., the line which rises from zero to Rs at the point of time when the sheet Q is shifted from the state of being transported by only the second roller 120 to the state of being transported by both the first roller 110 and the second roller 120, and falls from Rs to zero at an earlier stage than the point of time when the sheet Q is shifted from the state of being transported by both the first roller 110 and the second roller 120 to the state of being transported by only the first roller 110). However, if the follow-up performance of the control is good, or if the speed control error is allowable, then it is also possible to set the target tension Rr along the solid line of the lower part of FIG. 9 (i.e., the line which rises from zero to Rs at the point of time when the sheet Q is shifted from the state of being transported by only the second roller 120 to the state of being transported by both the first roller 110 and the second roller 120, and falls from Rs to zero at the point of time when the sheet Q is shifted from the state of being transported by both the first roller 110 and the second roller 120 to the state of being transported by only the first roller 110). Further, in the above embodiment, the first reaction force estimating portion 219 and the second reaction force estimating portion 229 estimate the reaction forces R1 and R2 acting on the first roller 110 and the second roller 120. However, this is not essential. The first reaction force estimating portion 219 can estimate a value related to the reaction force R1, instead of or in addition to the reaction force R1, and the second reaction force estimating portion 229 can estimate a value related to the reaction force R2, instead of or in addition to the reaction force R2. The tension calculating portion 222 can calculate the tension Ra using those values. Further, in the above embodiment, the target tension setting portion 221 sets the target tension Rr for the sheet Q. However, this is not essential. The target tension setting portion 221 can set a target value other than the target tension Rr, instead of or in addition to the target tension Rr. The tension controller 225 can calculate a control input Ur using the target value.

Further, the transport control device 60 may also be configured as a dedicated circuit such as ASIC, or configured by a microcomputer. In such a case, the transport control device 60 may include a CPU 61 and a ROM 63 as shown in FIG. 2 and can be configured such that the aforementioned function of each element of the transport control device 60 is realized by letting the CPU 61 carry out a process according to a program recorded in the ROM 63.

In the above embodiments, the program can be provided in such a manner as recorded in a computer-readable recording medium typified by a magnetic disk including flexible disks and the like, optical disk including DVD and the like, and a semiconductor memory including flash memory and the like. Further, the control device may also be configured as a dedicated circuit.

[Corresponding Relationship]

Finally, a corresponding relationship in terminology will be explained. The first driving circuit 71 and first motor 73 in the image forming system 1 correspond to an example of the first driving device, and the second driving circuit 81 and second motor 83 correspond to an example of the second driving device. Further, the first encoder 75 and first signal processing circuit 77 correspond to an example of the first measuring device, and the second encoder 85 and second signal processing circuit 87 correspond to an example of the second measuring device.

Further, the transport control device 60 corresponds to an example of the controller. In particular, the first reaction force estimating portion 219 and the second reaction force estimating portion 229 correspond respectively to an example of the first estimating unit and an example of the second estimating unit, and the speed controller 215 and the tension controller 225 correspond respectively to an example of the first calculating unit and an example of the second calculating unit.

Further, the first control input calculating portion 217 and first PWM signal generating portion 218 correspond to an example of the first drive controller, and the second control input calculating portion 227 and second PWM signal generating portion 228 correspond to an example of the second drive controller. Further, the target tension setting portion 221 corresponds to an example of the setting unit, and the ink jet head 31 corresponds to an example of the image forming device.

What is claimed is:

1. A transporting system comprising:
a first roller and a second roller arranged apart from each other along a transporting path of a sheet to transport the sheet;
a first driving device configured to drive the first roller to rotate;
a second driving device configured to drive the second roller to rotate;
a first measuring device configured to measure a state quantity Z1 concerning a rotary motion of the first roller;
a second measuring device configured to measure a state quantity Z2 concerning a rotary motion of the second roller; and
a controller configured to control an operation of transporting the sheet with rotations of the first roller and the second roller, by controlling the first driving device and the second driving device,
the controller being configured to perform:
estimating a value R1 related to a reaction force which acts on the first roller in a case that the first roller is driven to rotate by the first driving device;
estimating a value R2 related to a reaction force which acts on the second roller in a case that the second roller is driven to rotate by the second driving device;
calculating a control input U1 in accordance with a deviation between a target state quantity, and a state quantity of the sheet (Z1+Z2)/2 corresponding to a sum (Z1+Z2) of the state quantity Z1 measured by the first measuring device and the state quantity Z2 measured by the second measuring device;
calculating a control input U2 in accordance with a deviation between a target value, and a value (R1−R2)/2 corresponding to a difference (R1−R2) between the value R1 and the value R2;
inputting, to the first driving device, a control signal in accordance with a sum (U1+U2) of the control input U1 and the control input U2; and inputting, to the second driving device, a control signal in accordance with a difference (U1−U2) between the control input U1 and the control input U2.

2. The transporting system according to claim 1, wherein the value R1 is a reaction force which acts on the first roller in a case that the first roller is driven to rotate by the first driving device, the value R2 is a reaction force which acts on the second roller in a case that the second roller is driven to rotate by the second driving device, and the controller is configured to calculate the control input U2 in accordance with a deviation between a target tension as the target value, and a tension of the sheet as the value (R1−R2)/2.

3. The transporting system according to claim 2, wherein the controller is configured to set the target tension to a value in accordance with a position of the sheet in the transporting path.

4. The transporting system according to claim 3, wherein the controller sets the target tension to a nonzero specific value in a case that the sheet is transported by both the first roller and the second roller, but sets the target tension to zero in a case that the sheet is transported by only one of the first roller and the second roller.

5. The transporting system according to claim 4, wherein the controller changes the target tension from the specific value to zero before the sheet is changed from a state of being transported by both the first roller and the second roller to a state of being transported by only one of the first roller and the second roller.

6. The transporting system according to claim 4, wherein the specific value is a value in accordance with a type of the sheet.

7. The transporting system according to claim 5, wherein the specific value is a value in accordance with a type of the sheet, and the controller changes the target tension from the specific value to zero at an earlier stage for a greater magnitude of the specific value.

8. The transporting system according to claim 2, wherein the first measuring device measures a rotation speed of the first roller as the state quantity Z1; the second measuring device measures a rotation speed of the second roller as the state quantity Z2; and the controller calculates the control input U1 in accordance with a deviation between a speed of the sheet as the state quantity of the sheet (Z1+Z2)/2, and a target speed of the sheet as the target state quantity.

9. The transporting system according to claim 2, wherein above the transporting path, an image forming device is provided to form images on the sheet by jetting ink droplets, and the first roller and the second roller are arranged across a section which is defined within the transporting path and above which the image forming device is provided.

10. An image forming system comprising:
an image forming device provided above a transporting path of a sheet to form images on the sheet by jetting ink droplets;
a first roller and a second roller configured to transport the sheet and arranged in the transporting path across a section which is defined within the transporting path and above which the image forming device is provided;
a first driving device configured to drive the first roller to rotate;
a second driving device configured to drive the second roller to rotate;
a first measuring device configured to measure a rotation speed Z1 of the first roller;
a second measuring device configured to measure a rotation speed Z2 of the second roller; and
a controller configured to control an operation of transporting the sheet with rotations of the first roller and the second roller, by controlling the first driving device and the second driving device,
the controller being configured to perform:
estimating a value R1 related to a reaction force which acts on the first roller in a case that the first roller is driven to rotate by the first driving device;
estimating a value R2 related to a reaction force which acts on the second roller in a case that the second roller is driven to rotate by the second driving device;
calculating a control input U1 in accordance with a deviation between a target speed, and a speed of the sheet (Z1+Z2)/2 corresponding to a sum (Z1+Z2) of the rotation speed Z1 measured by the first measuring device and the rotation speed Z2 measured by the second measuring device;
calculating a control input U2 in accordance with a deviation between a target value, and a value (R1−R2)/2 corresponding to a difference (R1−R2) between the value R1 and the value R2;
inputting, to the first driving device, a control signal in accordance with a sum (U1+U2) of the control input U1 and the control input U2; and
inputting, to the second driving device, a control signal in accordance with a difference (U1−U2) between the control input U1 and the control input U2.

11. A controller controlling an operation of transporting a sheet by controlling a first driving device which drives a first roller to rotate and a second driving device which drives a second roller to rotate, in a transport mechanism performing the operation of transporting the sheet by rotating the first roller and the second roller which are arranged apart from each other along a transporting path of the sheet, the controller configured to perform:
estimating a value R1 related to a reaction force which acts on the first roller in a case that the first roller is driven to rotate by the first driving device;
estimating a value R2 related to a reaction force which acts on the second roller in a case that the second roller is driven to rotate by the second driving device;
calculating a control input U1 in accordance with a deviation between a target state quantity, and a state quantity of the sheet (Z1+Z2)/2 corresponding to a sum (Z1+Z2) of a state quantity Z1 and a state quantity Z2, by using the state quantity Z1 concerning a rotary motion of the first roller, and the state quantity Z2 concerning a rotary motion of the second roller, the state quantities Z1 and Z2 being measured by a measuring device;
calculating a control input U2 in accordance with a deviation between a target value, and a value (R1−R2)/2 corresponding to a difference (R1−R2) between the value R1 and the value R2;
inputting, to the first driving device, a control signal in accordance with a sum (U1+U2) of the control input U1 and the control input U2; and
inputting, to the second driving device, a control signal in accordance with a difference (U1−U2) between the control input U1 and the control input U2.

* * * * *